(12) United States Patent
Yang et al.

(10) Patent No.: US 12,254,921 B2
(45) Date of Patent: Mar. 18, 2025

(54) SENSE AMPLIFIER CIRCUIT ARCHITECTURE

(71) Applicant: CHANGXIN MEMORY TECHNOLOGIES, INC., Hefei (CN)

(72) Inventors: Guifen Yang, Hefei (CN); Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 167 days.

(21) Appl. No.: 18/151,466

(22) Filed: Jan. 8, 2023

(65) Prior Publication Data

US 2023/0162782 A1 May 25, 2023

Related U.S. Application Data

(63) Continuation of application No. PCT/CN2022/072740, filed on Jan. 19, 2022.

(30) Foreign Application Priority Data

Sep. 15, 2021 (CN) .......................... 202111082961.8

(51) Int. Cl.
G11C 7/02 (2006.01)
G11C 11/4091 (2006.01)

(52) U.S. Cl.
CPC ................................ *G11C 11/4091* (2013.01)

(58) Field of Classification Search
CPC .................................................. G11C 11/4091
USPC ......................................................... 365/207
See application file for complete search history.

(56) References Cited

U.S. PATENT DOCUMENTS

| | | | | |
|---|---|---|---|---|
| 6,765,815 B2 * | 7/2004 | Fujisawa | .............. | H10B 12/482 |
| | | | | 257/E27.084 |
| 7,129,549 B2 * | 10/2006 | Hasegawa | ................ | G11C 7/18 |
| | | | | 257/369 |
| 7,208,779 B2 * | 4/2007 | Ohta | ....................... | H01L 21/84 |
| | | | | 327/566 |
| 7,525,137 B2 * | 4/2009 | Walker | .................. | H10B 41/40 |
| | | | | 257/74 |

(Continued)

FOREIGN PATENT DOCUMENTS

| | | |
|---|---|---|
| CN | 103928402 A | 7/2014 |
| CN | 112582372 A | 3/2021 |
| CN | 112992892 A | 6/2021 |

*Primary Examiner* — Viet Q Nguyen
(74) *Attorney, Agent, or Firm* — Syncoda LLC; Feng Ma

(57) ABSTRACT

A sense amplifier circuit architecture includes a first NMOS layout, a second NMOS layout, a first PMOS layout, a second PMOS layout, a first processing structure layout and a second processing structure layout. The first NMOS layout includes first N-type active layers and first gate layers discretely arranged on the first N-type active layers. The second NMOS layout includes second N-type active layers and second gate layers discretely arranged on the second N-type active layers. The first PMOS layout includes first P-type active layers and third gate layers discretely arranged on the first P-type active layers. The second PMOS layout includes second P-type active layers and fourth gate layers discretely arranged on the second P-type active layers. The first processing structure layout includes first active layers and a first isolation gate. The second processing structure layout includes second active layers and a second isolation gate.

12 Claims, 15 Drawing Sheets

(56) References Cited

U.S. PATENT DOCUMENTS

| | | | | |
|---|---|---|---|---|
| 7,541,649 | B2* | 6/2009 | Ohguro | H01L 27/0207 |
| | | | | 257/E27.081 |
| 7,649,238 | B2* | 1/2010 | Watanabe | H01L 21/84 |
| | | | | 257/547 |
| 8,853,765 | B2* | 10/2014 | Lee | H01L 21/31053 |
| | | | | 257/321 |
| 9,196,725 | B2 | 11/2015 | Han | |
| 9,576,613 | B2* | 2/2017 | Paak | G11C 29/48 |
| 10,050,036 | B2 | 8/2018 | Han | |
| 10,535,388 | B1 | 1/2020 | Ingalls | |
| 10,803,925 | B2* | 10/2020 | Kim | G11C 11/4094 |
| 11,348,913 | B2* | 5/2022 | Jeong | H01L 23/5283 |
| 11,437,089 | B2* | 9/2022 | Kang | G11C 11/4091 |
| 11,462,536 | B2* | 10/2022 | Bowonder | H01L 29/7848 |
| 11,961,551 | B2* | 4/2024 | Chang | G11C 11/4091 |
| 12,033,691 | B2* | 7/2024 | Yang | G11C 11/4091 |
| 2008/0080282 | A1* | 4/2008 | Chang | G11C 7/18 |
| | | | | 365/205 |
| 2010/0097873 | A1* | 4/2010 | Lee | H01L 27/092 |
| | | | | 365/207 |
| 2014/0197480 | A1 | 7/2014 | Han et al. | |
| 2016/0043086 | A1 | 2/2016 | Han et al. | |
| 2018/0182449 | A1* | 6/2018 | Kim | G11C 11/4091 |
| 2020/0118614 | A1* | 4/2020 | Kim | G11C 11/4094 |
| 2021/0020210 | A1 | 1/2021 | Lee | |
| 2021/0288058 | A1* | 9/2021 | Nishimura | H10B 43/10 |
| 2022/0076732 | A1* | 3/2022 | Kang | H10B 12/50 |
| 2022/0383940 | A1* | 12/2022 | Yang | H10B 12/50 |
| 2023/0005522 | A1* | 1/2023 | Chi | G11C 11/4097 |
| 2023/0162762 | A1* | 5/2023 | Yang | G11C 7/1096 |
| | | | | 365/185.21 |
| 2023/0162782 | A1* | 5/2023 | Yang | G11C 7/06 |
| | | | | 365/207 |
| 2023/0223074 | A1* | 7/2023 | Yang | G11C 11/4097 |
| | | | | 365/63 |

* cited by examiner

SENSE AMPLIFIER CIRCUIT ARCHITECTURE

CROSS-REFERENCE TO RELATED APPLICATIONS

This is a continuation of International Patent Application No. PCT/CN2022/072740 filed on Jan. 19, 2022, which claims priority to Chinese Patent Application No. 202111082961.8 filed on Sep. 15, 2021. The disclosures of the above-referenced applications are hereby incorporated by reference in their entirety.

BACKGROUND

Dynamic random access memory (DRAM) writes data through charges in a cell capacitor. The cell capacitor is connected to a bit line and a bit line bar. In a DRAM, when a read operation or a refresh operation is performed, a sense amplifier senses and amplifies a voltage difference between the bit line and the bit line bar.

Semiconductor devices constituting the sense amplifier may have different device characteristics (e.g. threshold voltage) due to process variations, temperature and other factors. Different device characteristics will lead to offset noise in the sense amplifier, and the offset noise will reduce the effective sensing margin of the sense amplifier and the performance of DRAM.

SUMMARY

The present disclosure relates to the field of semiconductor circuit layout. In embodiments of the present disclosure, there is provided a sense amplifier circuit architecture, which cancels offset noise in the sense amplifier circuit without introducing more metal oxide semiconductor field effect transistors (MOSFET) for offset cancellation, and is beneficial to improve the integration of DRAM.

In the embodiments of the present disclosure, there is provided a sense amplifier circuit architecture, which includes a first N-Metal-Oxide-Semiconductor (NMOS) layout, a second NMOS layout, a first P-Metal-Oxide-Semiconductor (PMOS) layout, a second PMOS layout, a first processing structure layout and a second processing structure layout. The first NMOS layout includes first N-type active layers discretely arranged in a first direction, and first gate layers discretely arranged on the first N-type active layers; the second NMOS layout includes second N-type active layers discretely arranged in the first direction, and second gate layers discretely arranged on the second N-type active layers; the first PMOS layout includes first P-type active layers discretely arranged in the first direction, and third gate layers discretely arranged on the first P-type active layers; the second PMOS layout includes second P-type active layers discretely arranged in the first direction, and fourth gate layers discretely arranged on the second P-type active layers; the first processing structure layout includes first active layers discretely arranged in the first direction and extending in a second direction, and a first isolation gate arranged on the first active layers and extending in the second direction; the second processing structure layout includes second active layers discretely arranged in the first direction and extending in the second direction, and a second isolation gate arranged on the first active layers and extending in the second direction; the first direction intersects the second direction.

BRIEF DESCRIPTION OF THE DRAWINGS

The drawings herein are incorporated into and form part of the description, illustrate embodiments consistent with the disclosure, and together with the description explain the technical solution of the present disclosure.

DETAILED DESCRIPTION

Semiconductor devices constituting a sense amplifier may have different device characteristics (e.g. threshold voltage) due to process variations, temperature and other factors. Different device characteristics will lead to offset noise in the sense amplifier, and the offset noise will reduce the effective sensing margin of the sense amplifier and the performance of DRAM.

At present, in the process of cancelling offset noise of DRAM, MOS transistors for offset cancellation need to be specially designed, so as to increase the layout area required by the sensing amplifier circuit, which is not beneficial to improve the integration of DRAM. Therefore, how to cancel the offset noise in the sense amplifier circuit without introducing more MOS transistors for offset cancellation is an urgent problem to be solved at present.

In embodiments of the present disclosure, there is provided a sense amplifier circuit architecture, which includes a first NMOS layout, a second NMOS layout, a first PMOS layout, a second PMOS layout, a first processing structure layout and a second processing structure layout. The first NMOS layout includes first N-type active layers discretely arranged in a first direction, and first gate layers discretely arranged on the first N-type active layers. The second NMOS layout includes second N-type active layers discretely arranged in the first direction, and second gate layers discretely arranged on the second N-type active layers. The first PMOS layout includes first P-type active layers discretely arranged in the first direction, and third gate layers discretely arranged on the first P-type active layers. The second PMOS layout includes second P-type active layers discretely arranged in the first direction, and fourth gate layers discretely arranged on the second P-type active layers. The first processing structure layout includes first active layers discretely arranged in the first direction and extending in a second direction, and a first isolation gate arranged on the first active layers and extending in the second direction. The second processing structure layout includes second active layers discretely arranged in the first direction and extending in the second direction, and a second isolation gate arranged on the first active layers and extending in the second direction. The first direction intersects the second direction.

Those of ordinary skill in the art will appreciate that numerous technical details have been provided in various embodiments of the present disclosure for better understanding of the present disclosure by the reader. However, even without these technical details as well as various changes and modifications based on the following embodiments, the technical solutions claimed in the present disclosure may be realized.

Figure 1:
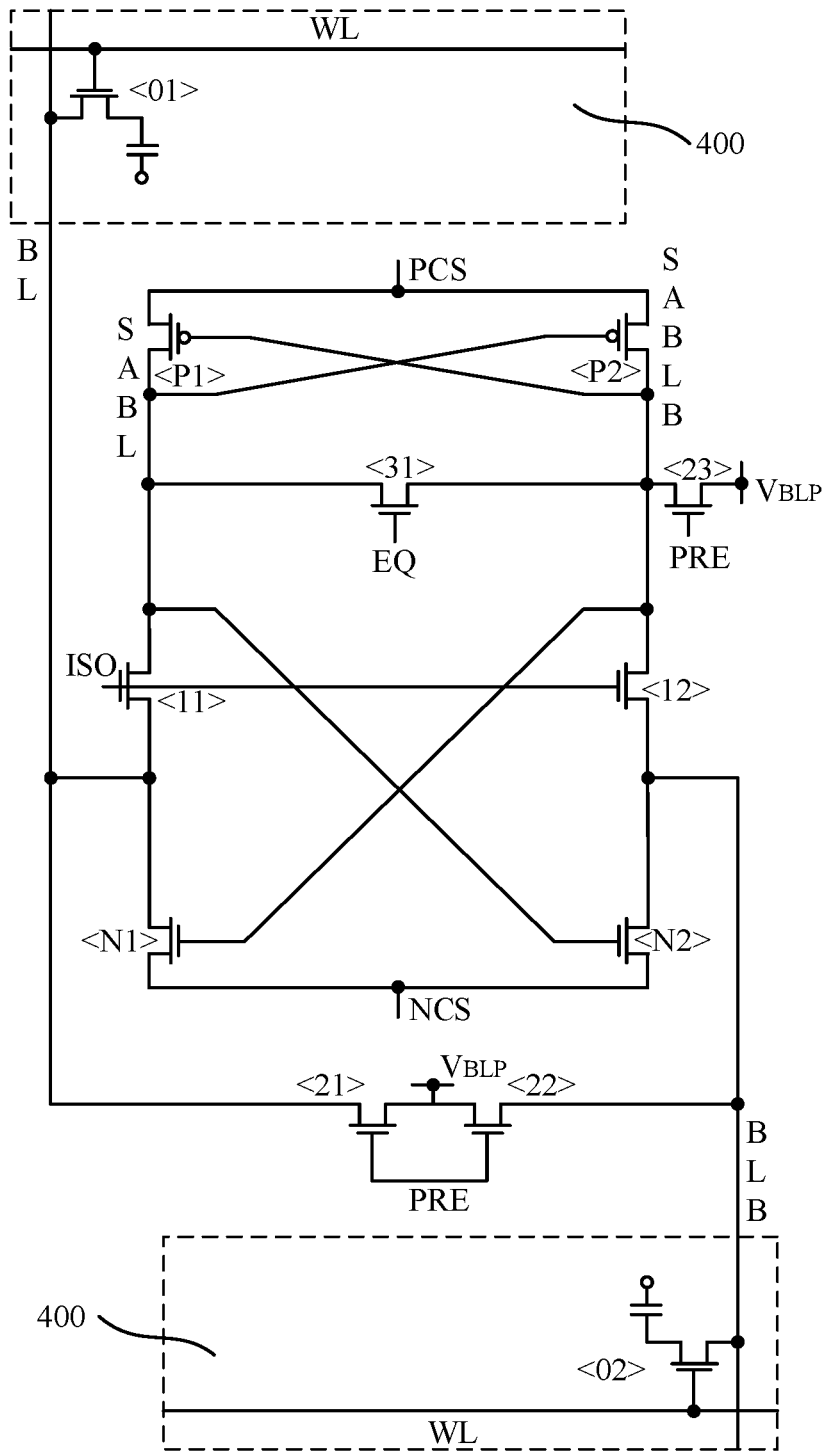
FIG. 1 is a circuit structure diagram of a sense amplifier circuit provided by an embodiment of the present disclosure.

FIG. 1 is a circuit structure schematic diagram of a sense amplifier circuit provided by an embodiment, and FIG. 2 to FIG. 15 are schematic diagrams of layout structure of a sense amplifier circuit provided by embodiments. The sense amplifier circuit architecture provided by each embodiment of the present disclosure is further described in detail with reference to the accompanying drawings, specifically as follows.

It should be noted that in the embodiments, taking the first direction perpendicular to the second direction as an example, the first direction is transverse (i.e., the extending direction of the memory array gap), and the second direction is longitudinal (i.e., the width direction of the memory array gap). Since perpendicularity is a special case of intersection, in other embodiments, those skilled in the art can set the intersection manner of the first direction and the second direction according to any angle, and the present embodiments are still applicable.

Figure 2:
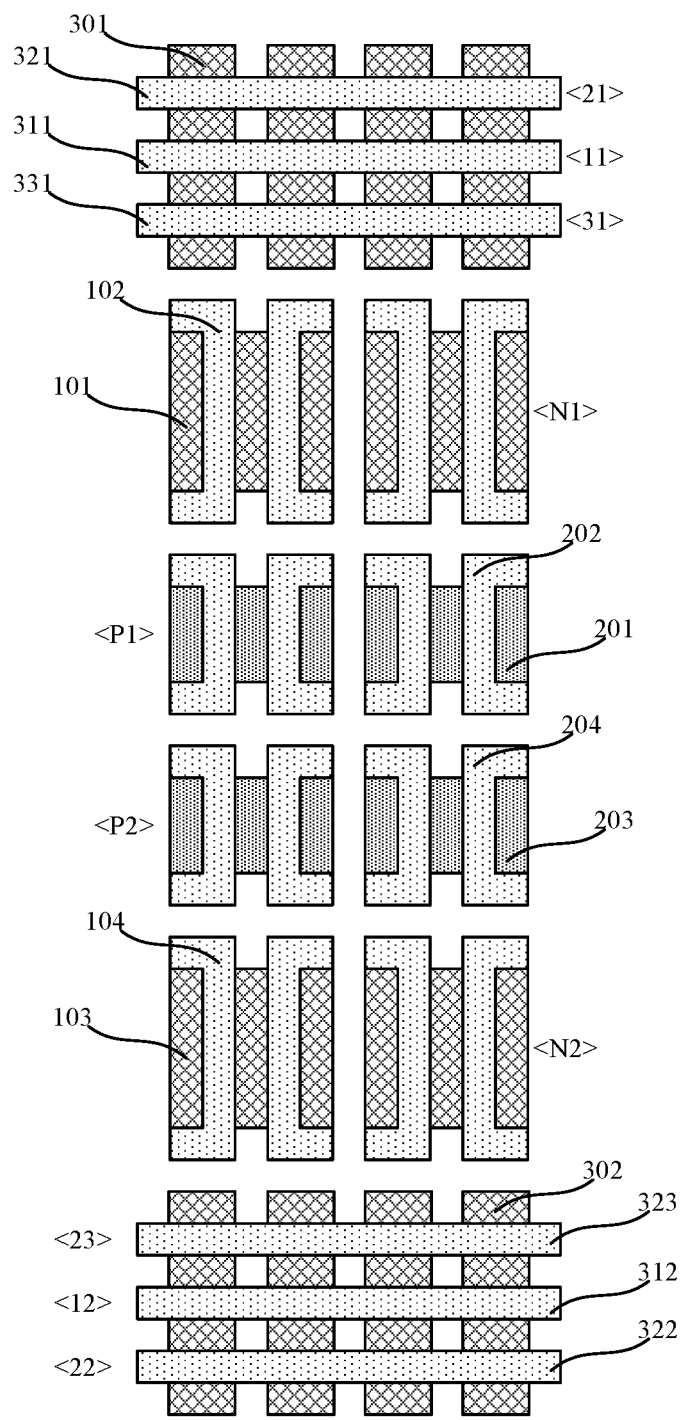
FIG. 2 is a first schematic diagram of layout structure of a sense amplifier circuit provided by embodiments of the present disclosure.

Referring to FIG. 1 and FIG. 2, a sense amplifier circuit architecture includes a first NMOS layout, a second NMOS layout, a first PMOS layout, a second PMOS layout, a first processing structure layout and a second processing structure layout.

The first NMOS layout includes first N-type active layers 101 discretely arranged in a first direction, and first gate layers 102 discretely arranged on the first N-type active layers 101. The first gate layers 102 are electrically connected to a sense amplifier bit line bar SABLB, and first N-type active layers 101 located on both sides of each first gate layer 102 are electrically connected to the bit line BL and a second signal terminal respectively.

The first NMOS layout is used to form a first NMOS transistor <N1>, the first NMOS transistor <N1> is connected between the second signal terminal and the bit line BL, and has a control terminal connected to the SABLB. In some embodiments, the source of the first NMOS transistor <N1> is connected to the second signal terminal, the drain of the first NMOS transistor <N1> is connected to the bit line BL, and the gate of the first NMOS transistor <N1> is connected to the SABLB.

The second NMOS layout includes second N-type active layers 103 discretely arranged in a first direction, and second gate layers 104 discretely arranged on the second N-type active layers 103. The second gate layers 104 are electrically connected to a sense amplifier bit line SABL, and second N-type active layers 103 located on both sides of each second gate layer 104 are electrically connected to a bit line bar BLB and the second signal terminal respectively.

The second NMOS layout is used to form a second NMOS transistor <N2>, the second NMOS transistor <N2> is connected between the second signal terminal and the BLB, and has a control terminal connected to the SABL. In some embodiments, the source of the second NMOS transistor <N2> is connected to the second signal terminal, the drain of the second NMOS transistor <N2> is connected to the BLB, and the gate of the second NMOS transistor <N2> is connected to the SABL.

The first PMOS layout includes first P-type active layers 201 discretely arranged in a first direction, and third gate layers 202 discretely arranged on the first P-type active layers 201. The third gate layers 202 are electrically connected to the SABLB, and first P-type active layers 201 located on both sides of each third gate layer 202 are electrically connected to the SABL and a first signal terminal respectively.

The first PMOS layout is used to form a first PMOS transistor <P1>, the first PMOS transistor <P1> is connected between the first signal terminal and the SABL, and has a control terminal connected to the SABLB. In some embodiments, the source of the first PMOS transistor <P1> is connected to the first signal terminal, the drain of the first PMOS transistor <P1> is connected to the SABL, and the gate of the first PMOS transistor <P1> is connected to the SABLB.

The second PMOS layout includes second P-type active layers 203 discretely arranged in a first direction, and fourth gate layers 204 discretely arranged on the second P-type active layers 203. The fourth gate layers 204 are electrically connected to the SABL, and second P-type active layers 203 located on both sides of each fourth gate layer 204 are electrically connected to the SABLB and the first signal terminal respectively.

The second PMOS layout is used to form a second PMOS transistor <P2>, the second PMOS transistor <P2> is connected between the first signal terminal and the SABLB, and has a control terminal connected to the SABL. In some embodiments, the source of the second PMOS transistor <P2> is connected to the first signal terminal, the drain of the second PMOS transistor <P2> is connected to the SABLB, and the gate of the second PMOS transistor <P2> is connected to the SABL.

The first processing structure layout includes first active layers 301 discretely arranged in the first direction and extending in a second direction, and a first isolation gate 311 arranged on the first active layers 301 and extending in the second direction. The first isolation gate 311 is used to receive an isolation signal (ISO), and the first active layers 301 located on both sides of the first isolation gate 311 are electrically connected to the bit line BL and the SABL respectively.

The first active layers 301 and the first isolation gate 311 are used to form a first isolation MOS transistor <11>. The source of the first isolation MOS transistor <11> is connected to the BL, the drain of the first isolation MOS transistor <11> is connected to the SABL, the gate of the first isolation MOS transistor <11> is used to receive the isolation signal ISO, and the first isolation MOS transistor <11> is used to be turned on according to the isolation signal to electrically connect the BL to the SABL.

The second processing structure layout includes second active layers 302 discretely arranged in the first direction and extending in a second direction, and a second isolation gate 312 arranged on the second active layers 302 and extending in the second direction. The second isolation gate 312 is used to receive an isolation signal ISO, and the second active layers 302 located on both sides of the second isolation gate 312 are electrically connected to the BLB and the SABLB respectively.

The second active layers 302 and the second isolation gate 312 are used to form a second isolation MOS transistor <12>. The source of the second isolation MOS transistor <12> is connected to the BLB, the drain of the second isolation MOS transistor <12> is connected to the SABLB, the gate of the second isolation MOS transistor <12> is used to receive the isolation signal ISO, and the second isolation MOS transistor <12> is used to be turned on according to the isolation signal to electrically connect the BLB to the SABLB.

For a bit line BL and a bit line bar BLB, the BL is connected to memory cells <01> of one of the adjacent memory arrays 400, and the BLB is connected to memory cells <02> of the other memory array 400 of the adjacent memory arrays 400.

In the offset cancellation process, both the first signal terminal and the second signal terminal are used to receive the high level corresponding to the logic "1". In the data readout process, the first signal terminal is used to receive the high level corresponding to the logic "1", and the second signal terminal is used to receive the low level corresponding to the logic "0". In the present embodiments, the voltage of the first level signal, i.e., positive cell storing signal (PCS) is greater than the voltage of the second level signal, i.e., negative cell storing signal (NCS). That is, the first level signal PCS is a high level corresponding to the logic "1" and the second level signal NCS is a low level corresponding to the logic "0". In other embodiments, the voltage of the first level signal may also be set to be less than the voltage of the second level signal. That is, the first level signal PCS is a low level corresponding to logic "0" and the second level signal NCS is a high level corresponding to logic "1".

For the memory, the bit line BL, the bit line bar BLB, the sense amplifier bit line SABL, and the sense amplifier bit line bar SABLB are precharged to a preset voltage prior to data readout.

For the sense amplifier circuit of the present embodiment, in a first readout stage, i.e. an offset cancellation stage of the memory, a first level signal PCS is provided to a first signal terminal and a second signal terminal. The gate of the first PMOS transistor <P1> is connected to the SABLB, the drain of the first PMOS transistor <P1> is connected to the SABL, and the source of the first PMOS transistor <P1> is connected to the first signal terminal. After the first PMOS transistor <P1> is turned on based on the preset voltage of the SABLB, the first signal terminal is electrically connected to the SABL, and the SABL is pulled up under the action of the first level signal PCS. The gate of the second PMOS transistor <P2> is connected to the SABL, the drain of the second PMOS transistor <P2> is connected to the SABLB, and the source of the second PMOS transistor <P2> is connected to the first signal terminal. After the second PMOS transistor <P2> is turned on based on the preset voltage of the SABL, the first signal terminal is electrically connected to the SABLB, and the SABLB is pulled up under the action of the second level signal PCS.

After the level of the SABL and the level of the SABLB are pulled up, the first PMOS transistor <P1> and the second PMOS transistor <P2> are turned off. However, since the semiconductor devices constituting the sense amplifier may have different device characteristics (e.g., threshold voltage) due to the influence of process variations, temperature and other factors, That is, due to the influence of external factors or formation process, the threshold voltage of the first PMOS transistor <P1> and the threshold voltage of the second PMOS transistor <P2> are different. That is, the first PMOS transistor <P1> and the second PMOS transistor <P2> have different conduction capabilities after being turned on based on the preset voltage. After the first PMOS transistor <P1> and the second PMOS transistor <P2> are turned on, the SABL and the SABLB have different levels, that is, the offset noise of the first PMOS transistor <P1> and the second PMOS transistor <P2>. Due to the connection manner of the first isolation MOS transistor <11> and the second isolation MOS transistor <12>, the first isolation MOS transistor <11> and the second isolation MOS transistor <12> are not turned on during the offset cancellation process. At this time, the level of the SABL is not synchronized to the BL, and the level of the SABLB is not synchronized to the BLB.

After the level of the SABL and the level of the SABLB are pulled up, since the gate of the first NMOS transistor <N1> is connected to the SABLB, the drain of the first NMOS transistor <N1> is connected to the bit line BL, and the source of the first NMOS transistor <N1> is connected to the second signal terminal, the first NMOS transistor <N1> is turned on based on the pulled up SABLB, the bit line BL is electrically connected to the second signal terminal after the first NMOS transistor <N1> is turned on, and the bit line BL is pulled up under the action of the first level signal PCS. Since the gate of the second NMOS transistor <N2> is connected to the SABL, the drain of the second NMOS transistor <N2> is connected to the BLB, and the source of the second NMOS transistor <N2> is connected to the second signal terminal, the second NMOS transistor <N2> is turned on based on the pulled up SABL, and the bit line bar BLB is electrically connected to the second signal terminal after the second NMOS transistor <N2> is turned on, and the BLB is pulled up under the action of the first level signal PCS.

The semiconductor devices constituting sense amplifier may have different device characteristics (e.g. threshold voltages) due to process variations, temperature, and other factors. That is, due to the influence of external factors or formation process, the threshold voltage of the first NMOS transistor <N1> and the threshold voltage of the second NMOS transistor <N2> are different. That is, the first NMOS transistor <N1> and the second NMOS transistor <N2> have different conduction capabilities after being turned on based on the preset voltage. After the first NMOS transistor <N1> and the second NMOS transistor <N2> are turned on, the BL and the BLB have different levels, and the conduction voltage of the first NMOS transistor <N1> and the conduction voltage of the second NMOS transistor <N2> include the offset noise of the first PMOS transistor <P1> and the offset noise of the second PMOS transistor <P2>. At this time, the level difference between the BL and the BLB includes the offset noise of the first PMOS transistor <P1> and the second PMOS transistor <P2> and the offset noise of the first NMOS transistor <N1> and the second NMOS transistor <N2>. Assuming that the first PMOS transistor <P1> and the first NMOS transistor <N1> are taken as reference, the threshold voltage of the second PMOS transistor <P2> and the threshold voltage of the second NMOS transistor <N2> are smaller than that of the first PMOS transistor <P1> and of the first NMOS transistor <N2> respectively, and after offset cancellation, the voltage of the bit line BL is smaller than the voltage of the BLB based on the above discussion.

In the data sharing stage, the voltage of the target memory cell(s) is shared to the bit line BL, and the voltage of the target memory cell(s) is shared to the BLB. At this time, due to the execution of the offset cancellation process, the actual voltage of the bit line BL is smaller than the theoretical voltage. Thus, in the second readout stage, i.e. the actual sense amplification stage, the first isolation MOS transistor <11> and the second isolated MOS transistor <12> are turned on, the BL is electrically connected to the SABL, and the bit line bar BLB is electrically connected to the SABLB, so that the second PMOS transistor <P2> and the second NMOS transistor <N2>, which originally have smaller threshold voltages, receives smaller gate voltage, thereby realizing offset cancellation of the sense amplifier circuit.

Therefore, the layout of the sense amplifier circuit provided by the embodiment of the present disclosure can avoid providing the MOS transistors for offset cancellation, thereby reducing the layout area of the sense amplifier circuit.

In an embodiment, referring to FIG. 2, the sense amplifier circuit architecture further includes the following.

The first processing structure layout further includes a first precharge gate 321, arranged on the first active layers 301 and extending in the first direction, and the first precharge gate 321 and the first isolation gate 311 are arranged in the second direction in sequence. The first precharge gate 321 is used to receive a precharge signal (PRE), and the first active layers 301 located on both sides of the first precharge gate 321 and away from the first isolation gate 311 are used to receive a preset voltage $V_{BLP}$. The first active layers 301 located on both sides of the first precharge gate 321 and shared with the first isolation gate 311 are connected to a bit line BL.

The first precharge gate 321 and the first active layers 301 are used to form a first precharge MOS transistor <21>, a terminal of the first precharge MOS transistor <21> is connected to a bit line BL, the other terminal is used to receive a preset voltage $V_{BLP}$, and the control terminal is used to receive a precharge signal PRE, and the first precharge MOS transistor <21> is configured to be turned on based on the PRE. In the present embodiment, the source of the first precharge MOS transistor <21> is connected to the bit line BL, the drain of the first precharge MOS transistor <21> is used for receiving the preset voltage $V_{BLP}$, and the gate of the first precharge MOS transistor <21> is used to receive the precharge signal PRE.

In the present embodiment, the preset voltage $V_{BLP}=\frac{1}{2} V_{DD}$, where $V_{DD}$ is the internal power supply voltage of the chip. In other embodiments, the preset voltage $V_{BLP}$ may be set according to a specific application scenario.

The second processing structure layout further includes a second precharge gate 322 and a third precharge gate 323, arranged on the second active layers 302 and extending in the first direction, and the second precharge gate 322, the second isolation gate 312 and the third precharge gate 323 are arranged in the second direction in sequence. The second precharge gate 322 is used to receive a PRE. The second active layers 302 located on both sides of the second precharge gate 322 and away from the second isolation gate 312 are used to receive a preset voltage $V_{BLP}$. The second active layers 302 located on both sides of the second precharge gate 322 and shared with the second isolation gate 312 are connected to a bit line bar BLB. The third precharge gate 323 is used to receive a PRE. The second active layers 302 located on both sides of the third precharge gate 323 and away from the second isolation gate 312 are used to receive a preset voltage $V_{BLP}$. The second active layers 302 located on both sides of the third precharge gate 323 and shared with the second isolation gate 312 are connected to a sense amplifier bit line SABL or a sense amplifier bit line bar SABLB.

The second precharge gate 322 and the second active layers 302 are used to form a second precharge MOS transistor <22>, a terminal of the second precharge MOS transistor <22> is connected to a bit line bar BLB, the other terminal is used to receive a preset voltage $V_{BLP}$, and the control terminal is used to receive a precharge signal PRE, and the second precharge MOS transistor <22> is configured to be turned on based on the PRE. In the present embodiment, the source of the second precharge MOS transistor <22> is connected to the BLB, the drain of the second precharge MOS transistor is used to receive the preset voltage $V_{BLP}$, and the gate of the second precharge MOS transistor is used to receive the precharge signal PRE.

In a particular example, the terminal of the first precharge MOS transistor <21> for receiving the preset voltage $V_{BLP}$ is connected to the terminal of the second precharge MOS transistor <22> for receiving the preset voltage $V_{BLP}$. In some embodiments, the drain of the first precharge MOS transistor <21> is connected to the drain of the second precharge MOS transistor <22> for receiving the preset voltage $V_{BLP}$.

In some embodiments, the control terminal of the first precharge MOS transistor <21> is connected to the control terminal of the second precharge MOS transistor <22>, i.e. the gate of the first precharge MOS transistor <21> is connected to the gate of the second precharge MOS transistor <22> for receiving the precharge signal PRE.

The third precharge gate 323 and the second active layers 302 are used to form a third precharge MOS transistor <23>, a terminal of the third precharge MOS transistor <23> is connected to a sense amplifier bit line SABL or a sense amplifier bit line bar SABLB, the other terminal is used to receive a preset voltage $V_{BLP}$, and the control terminal is used to receive a precharge signal PRE, and the third precharge MOS transistor <23> is configured to be turned on based on the PRE. In the present embodiment, the source of the third precharge MOS transistor <23> is connected to a sense amplifier bit line SABL or a sense amplifier bit line bar SABLB, the drain of the third precharge MOS transistor <23> is used to receive the preset voltage $V_{BLP}$, and the gate of the third precharge MOS transistor <23> is used to receive the precharge signal PRE.

Further, the first processing structure layout further includes an equalizing gate 331, arranged on the first active layers 301 and extending in the first direction, and the first precharge gate 321, the first isolation gate 311, and the equalizing gate 331 are arranged in the second direction in sequence. The equalizing gate 331 is used to receive an equalizing signal (EQ). The first active layers 301 located on both sides of the equalizing gate 331 and away from the first isolation gate 311 are connected to a sense amplifier bit line bar SABLB. The first active layers 301 located on both sides of the equalizing gate 331 and shared with the first isolation gate 311 are connected to the SABL.

The equalizing gate 331 and the first active layers 301 are used to form an equalizing MOS transistor <31>, the equalizing MOS transistor <31> is connected between the SABL and the SABLB and having a control terminal for receiving the equalizing signal EQ. In the present embodiment, the source of the equalizing MOS transistor <31> is connected to the SABL, the drain of the equalizing MOS transistor <31> is connected to the SABLB, and the gate of the equalizing MOS transistor <31> is used to receive the equalizing signal EQ.

In the process of offset cancellation, the level of the bit line BL and the level of the BLB are only influenced by the first NMOS transistor <N1> and the second NMOS transistor <N2>. That is, during the process of offset cancellation, an equalizing signal EQ may also be provided to turn on the equalizing MOS transistor <31>, so that the SABL and the SABLB are electrically connected to ignore the offset influence of the first PMOS transistor <P1> and the second PMOS transistor <P2>, thereby more accurately cancelling the offset noise of the first NMOS transistor <N1> and the second NMOS transistor <N2>.

Figure 3:
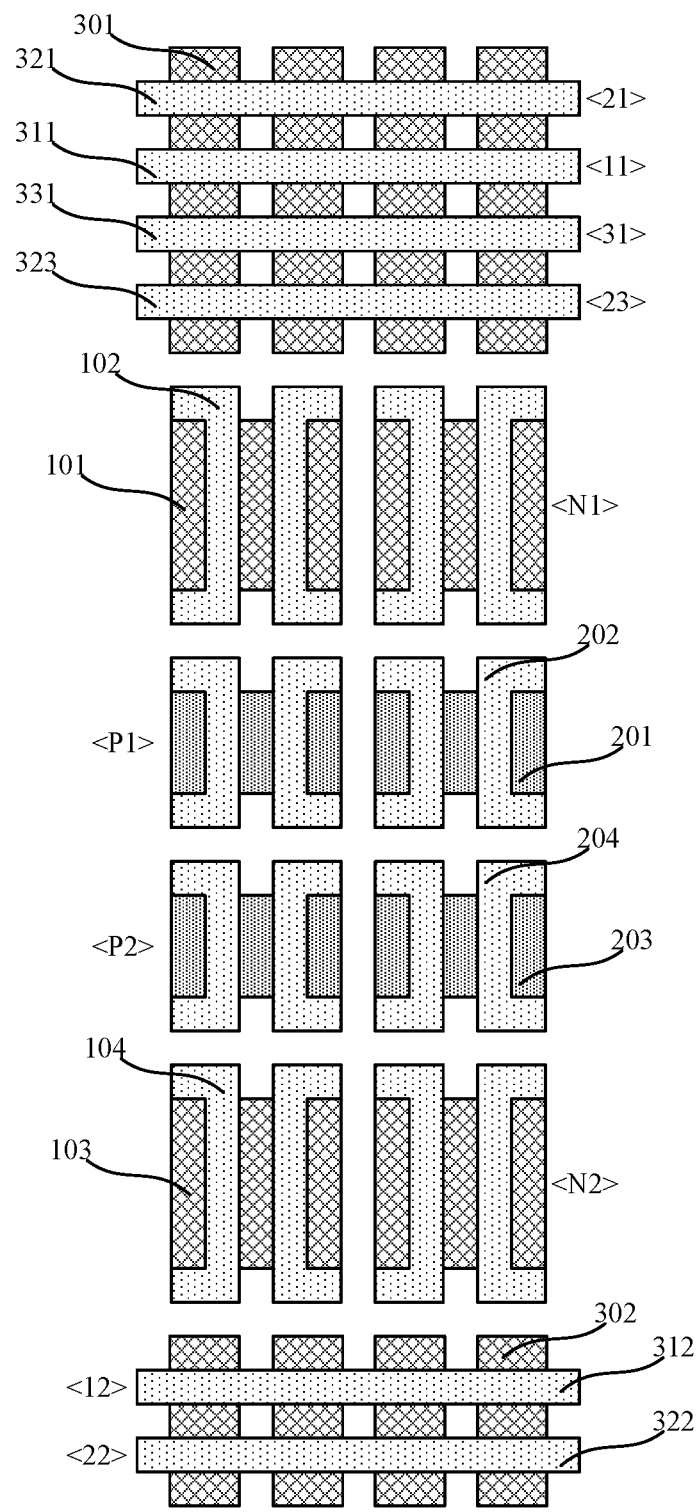
FIG. 3 is a second schematic diagram of layout structure of a sense amplifier circuit provided by embodiments of the present disclosure.
Figure 4:
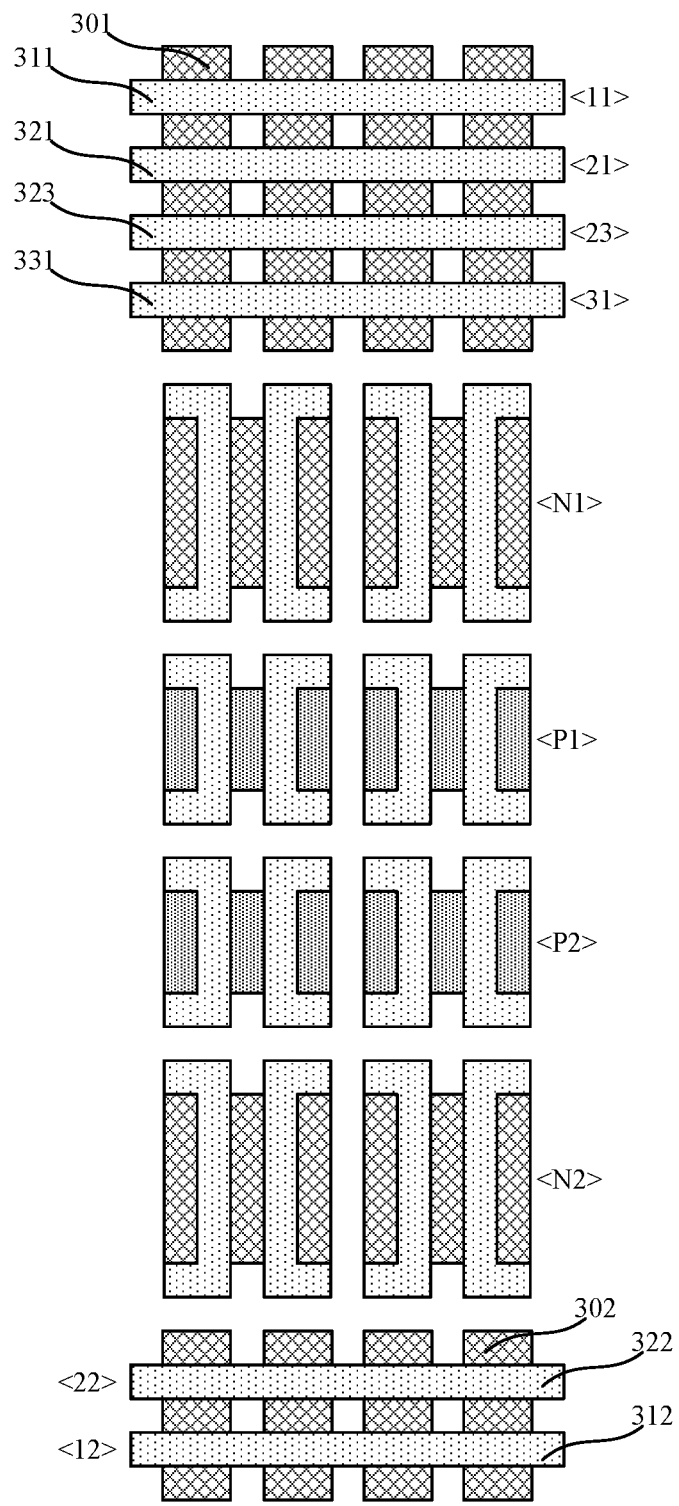
FIG. 4 is a third schematic diagram of layout structure of a sense amplifier circuit provided by embodiments of the present disclosure.

In another embodiment, referring to FIG. 3 and FIG. 4, the sense amplifier circuit architecture further includes the following.

Referring to FIG. 3, the first processing structure layout further includes a first precharge gate 321 and a third precharge gate 323, arranged on the first active layers 301 and extending in the first direction, and the first precharge gate 321, the first isolation gate 311 and the third precharge gate 323 are arranged in the second direction in sequence. The first precharge gate 321 is used to receive a precharge signal PRE. The first active layers 301 located on both sides of the first precharge gate 321 and away from the first isolation gate 311 are used to receive a preset voltage $V_{BLP}$. The first active layers 301 located on both sides of the first precharge gate 321 and shared with the first isolation gate 311 are connected to a bit line BL. The third isolation gate 323 is used to receive a precharge signal PRE. The first active layers 301 located on both sides of the third precharge gate 323 and away from the first isolation gate 311 are used to receive a preset voltage $V_{BLP}$. The first active layers 301 located on both sides of the third precharge gate 323 and shared with the first isolation gate 311 are connected to a sense amplifier bit line SABL or a sense amplifier bit line bar SABLB. The first precharge gate 321 and the first active layers 301 are used to form a first precharge MOS transistor <21>, and the third precharge gate 323 and the first active layers 301 are used to form a third precharge MOS transistor <23>.

Further, the first processing structure layout further includes an equalizing gate 331, arranged on the first active layers 301 and extending in the first direction, and the first precharge gate 321, the first isolation gate 311, the equalizing gate 331 and the third precharge gate 323 are arranged in the second direction in sequence. The equalizing gate 331 is used to receive an equalizing signal EQ. The first active layers 301 located on both sides of the equalizing gate 331 and shared with the third precharge gate 323 are connected to a sense amplifier bit line SABL. The first active layers 301 located on both sides of the equalizing gate 331 and shared with the first isolation gate 311 is connected to the sense amplifier bit line bar SABLB. The equalizing gate 331 and the first active layers 301 are used to form an equalizing MOS transistor <31>.

The second processing structure layout further includes a second precharge gate 322, arranged on the second active layers 302 and extending in the first direction, and the second precharge gate 322 and the second isolation gate 312 are arranged in the second direction in sequence. The second precharge gate 322 is used to receive a precharge signal PRE, and the second active layers 302 located on both sides of the second precharge gate 322 and away from the second isolation gate 312 are used to receive a preset voltage $V_{BLP}$. The second active layers 302 located on both sides of the second precharge gate 322 and shared with the second isolation gate 312 are connected to a bit line bar BLB. The second precharge gate 322 and the second active layers 302 are used to form a second precharge MOS transistor <22>.

Referring to FIG. 4, the first processing structure layout may be arranged in a manner that the first isolation gate 311, the first precharge gate 321, the third precharge gate 323 and the equalizing gate 331 are arranged in sequence in the second direction, and the second processing structure layout may be arranged in a manner that the second isolation gate 312 and the second precharge gate 322 are arranged in sequence in the second direction.

Figure 5:
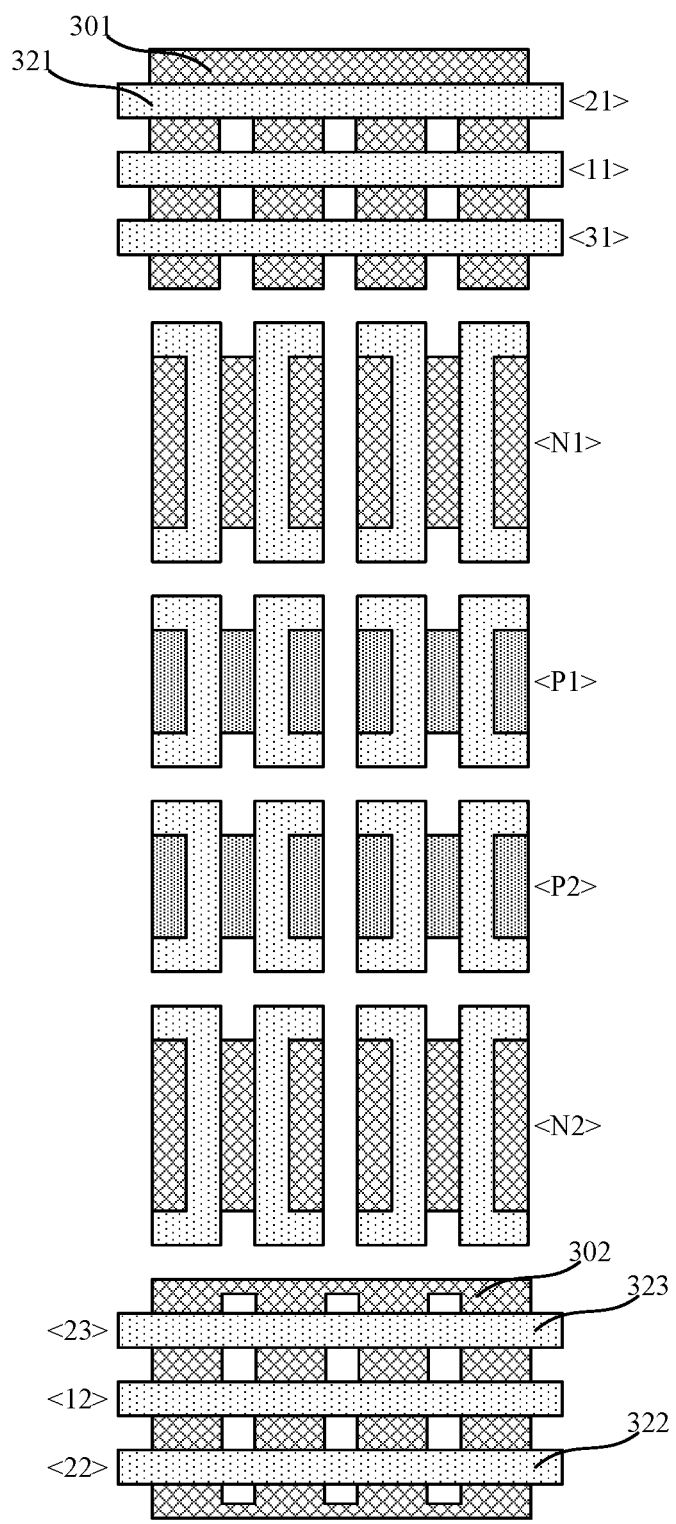
FIG. 5 is a fourth schematic diagram of layout structure of a sense amplifier circuit provided by embodiments of the present disclosure.
Figure 6:
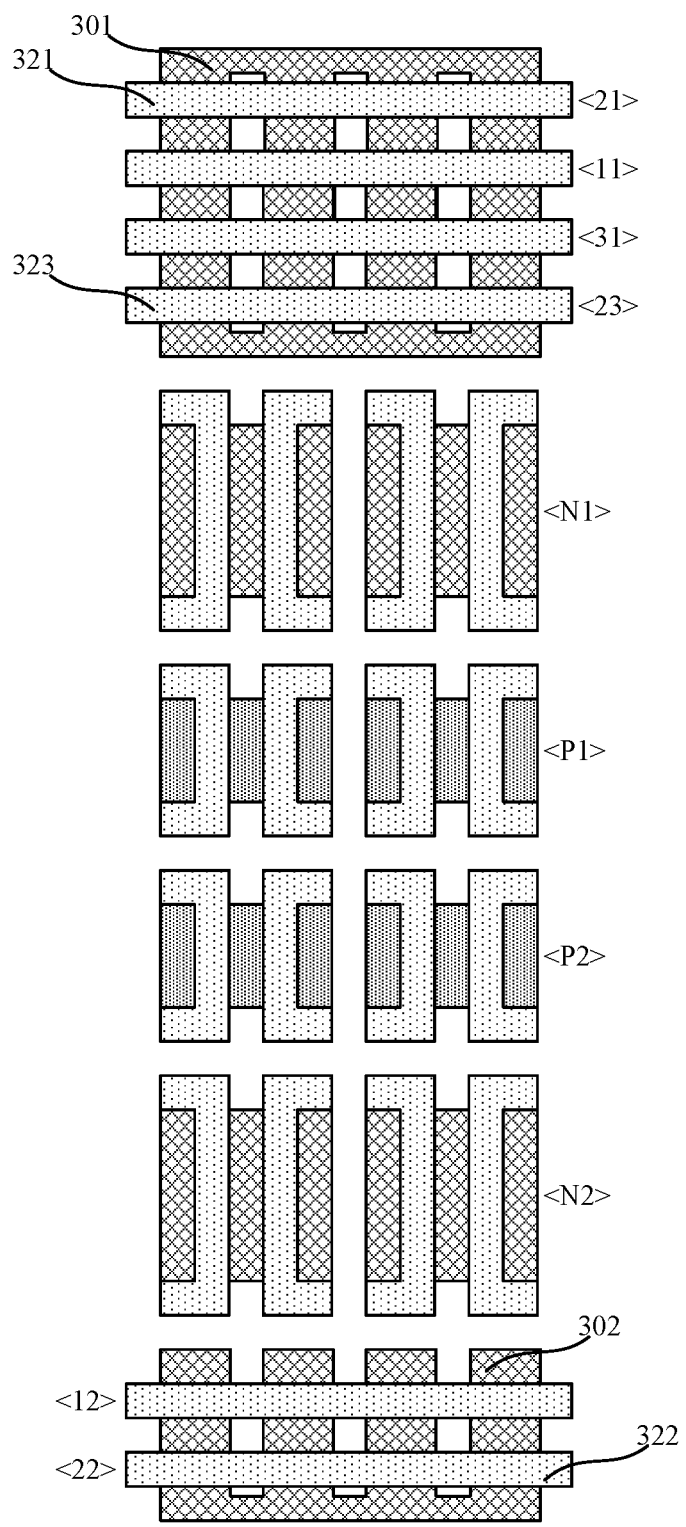
FIG. 6 is a fifth schematic diagram of layout structure of a sense amplifier circuit provided by embodiments of the present disclosure.
Figure 7:
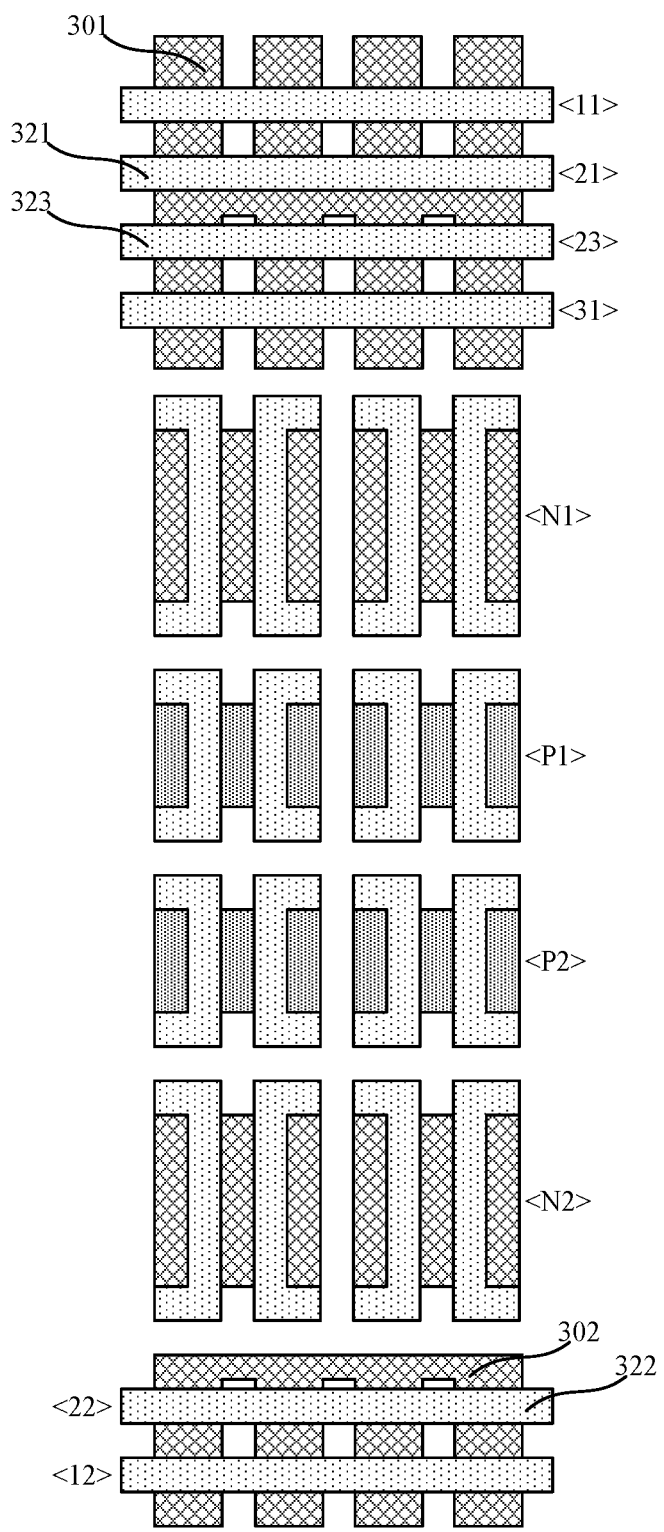
FIG. 7 is a sixth schematic diagram of layout structure of a sense amplifier circuit provided by embodiments of the present disclosure.

In an example, referring to FIG. 5 to FIG. 7, in the first direction, the first active layers 301 for electrically connecting a preset voltage $V_{BLP}$ are connected to each other, and the second active layers 302 for electrically connecting the preset voltage $V_{BLP}$ are connected to each other.

In some embodiments, referring to FIG. 5, in the first active layers 301, active regions for connecting the preset voltage $V_{BLP}$ are connected to each other in a plurality of first precharge MOS transistors <21> arranged in the first direction. In the second active layers 302, active regions for connecting the preset voltage $V_{BLP}$ are connected to each other in a plurality of second precharge MOS transistors <22> arranged in the first direction; and active regions for connecting the preset voltage $V_{BLP}$ are connected to each other in a plurality of third precharge MOS transistors <23> arranged in the first direction.

In some embodiments, referring to FIG. 6, in the first active layers 301, active regions for connecting the preset voltage $V_{BLP}$ are connected to each other in a plurality of first precharge MOS transistors <21> arranged in the first direction; and active regions for connecting the preset voltage $V_{BLP}$ are connected to each other in a plurality of third precharge MOS transistors <23> arranged in the first direction. In the second active layers 302, active regions for connecting the preset voltage $V_{BLP}$ are connected to each other in a plurality of second precharge MOS transistors <22> arranged in the first direction.

In some embodiments, referring to FIG. 7, in the first active layers 301, active regions for connecting the preset voltage $V_{BLP}$ are connected to each other in a plurality of first precharge MOS transistors <21> and a plurality of third precharge MOS transistors <23> arranged in the first direction. In the second active layers 302, active regions for connecting the preset voltage $V_{BLP}$ are connected to each other in a plurality of second precharge MOS transistors <22> arranged in the first direction.

In addition, the embodiment also provides a plurality of arrangement manners of the first processing structure layout, the second processing structure layout, the first NMOS layout, the second NMOS layout, the first PMOS layout and the second PMOS layout.

Referring to FIG. 2 to FIG. 7, the first layout manner means that in the second direction, the first processing structure layout, the first NMOS layout, the first PMOS layout, the second PMOS layout, the second NMOS layout and the second processing structure layout are arranged in sequence.

Figure 8:
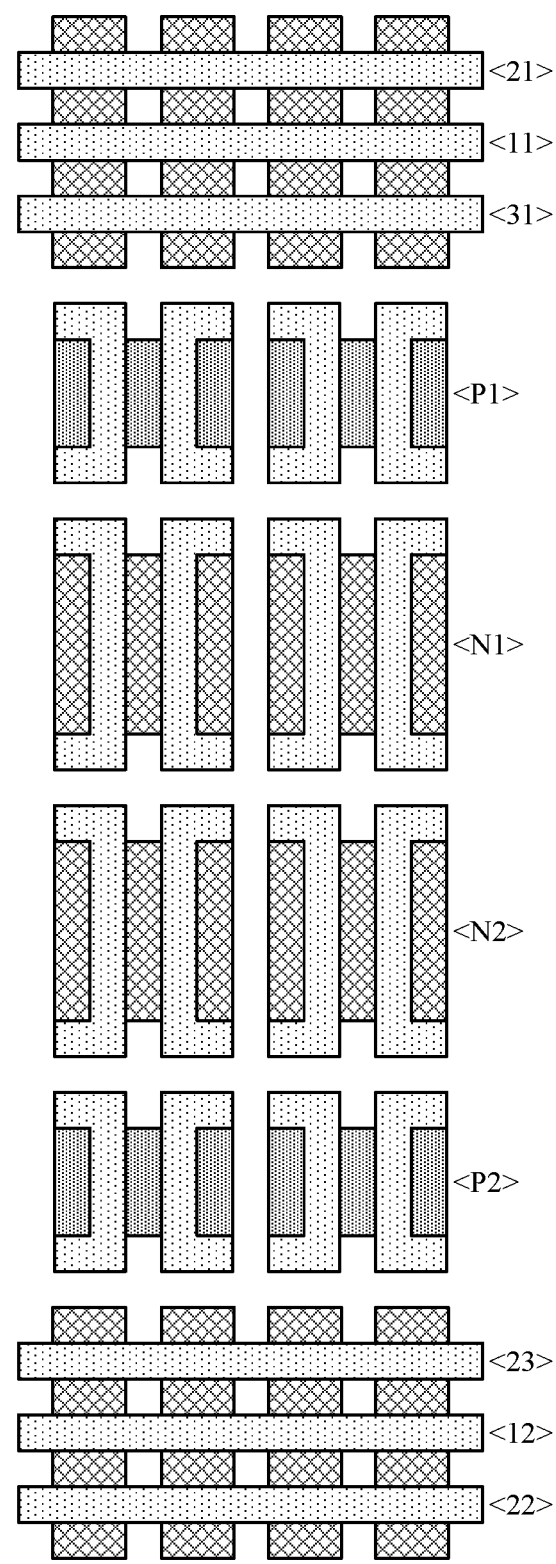
FIG. 8 is a seventh schematic diagram of layout structure of a sense amplifier circuit provided by embodiments of the present disclosure.
Figure 9:
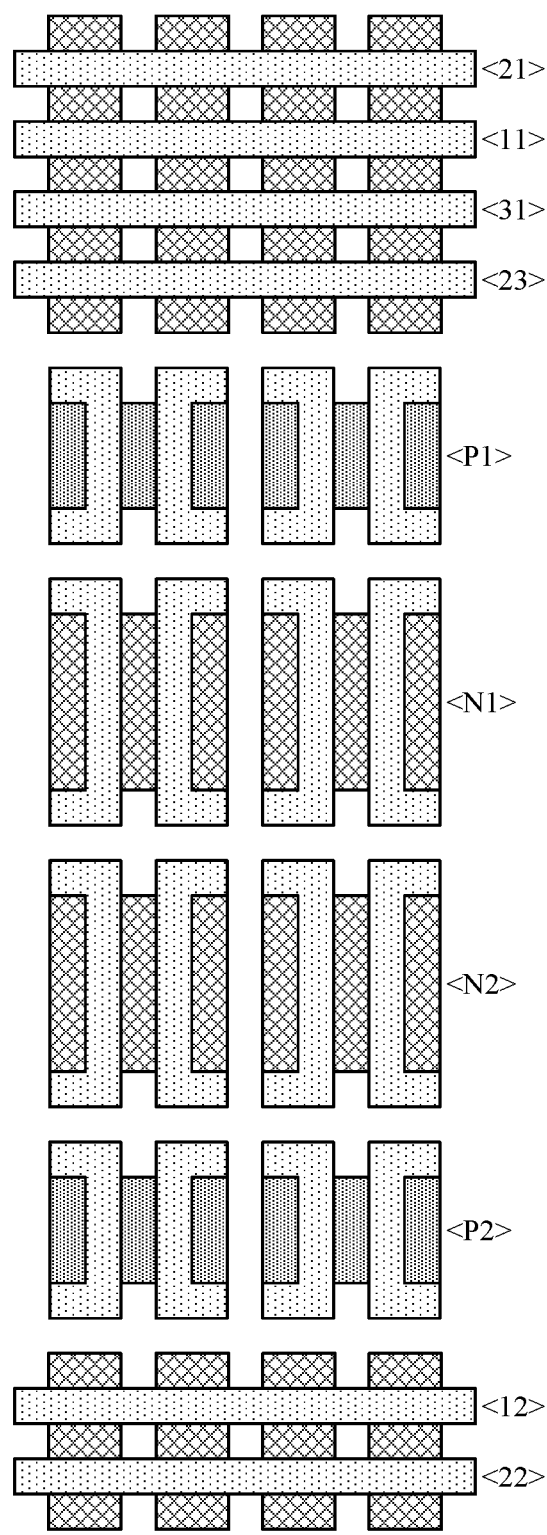
FIG. 9 is an eighth schematic diagram of layout structure of a sense amplifier circuit provided by embodiments of the present disclosure.
Figure 10:
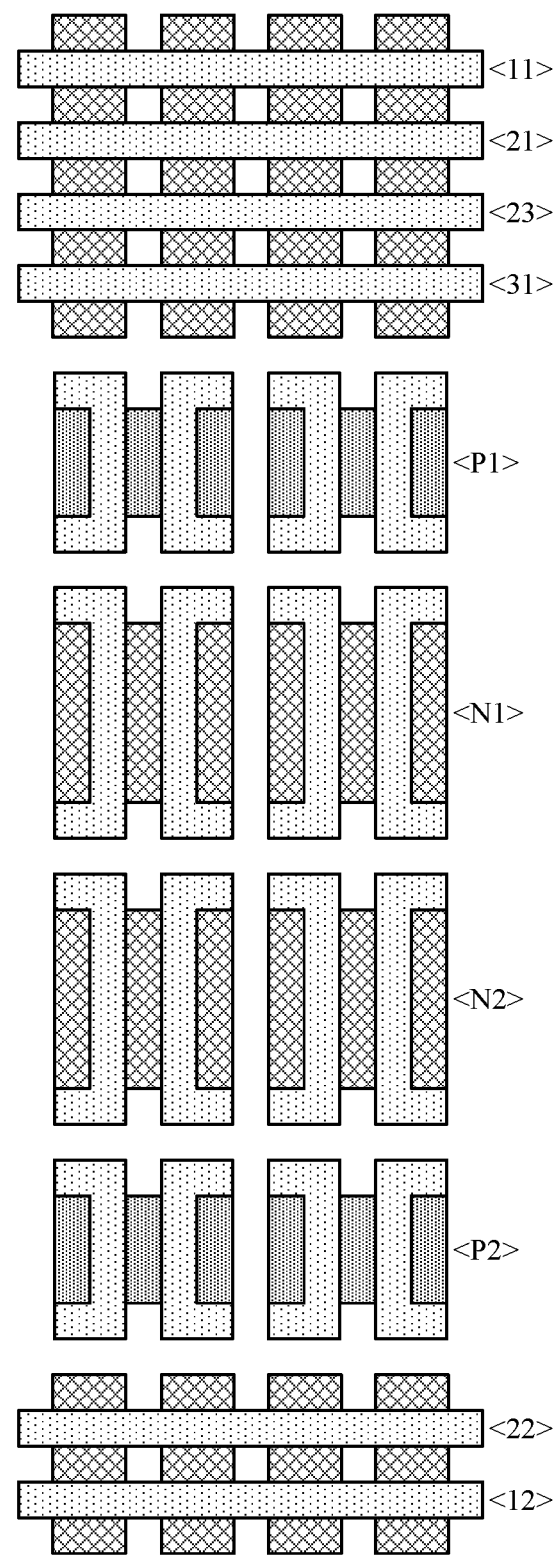
FIG. 10 is a ninth schematic diagram of layout structure of a sense amplifier circuit provided by embodiments of the present disclosure.

Referring to FIG. 8 to FIG. 10, the second layout manner means that in the second direction, the first processing structure layout, the first PMOS layout, the first NMOS layout, the second NMOS layout, the second PMOS layout and the second processing structure layout are arranged in sequence.

It should be noted that this manner is also applicable to the way in which the first active layers 301 for electrically connecting the preset voltage $V_{BLP}$ are connected with each other and the second active layers 302 for electrically connecting the preset voltage $V_{BLP}$ are connected with each other. However, the corresponding drawings are not given in this embodiment, and those skilled in the art can reasonably deduce and know according to the contents disclosed in the first layout manner.

Figure 11:
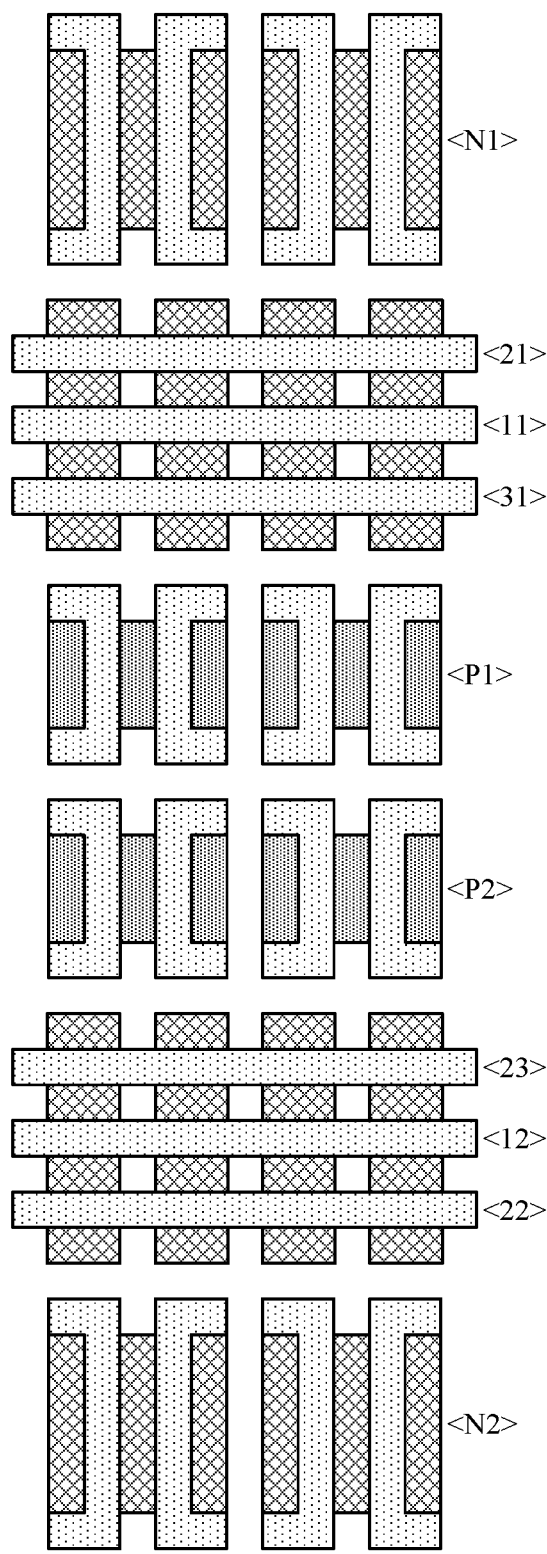
FIG. 11 is a tenth schematic diagram of layout structure of a sense amplifier circuit provided by embodiments of the present disclosure.
Figure 12:
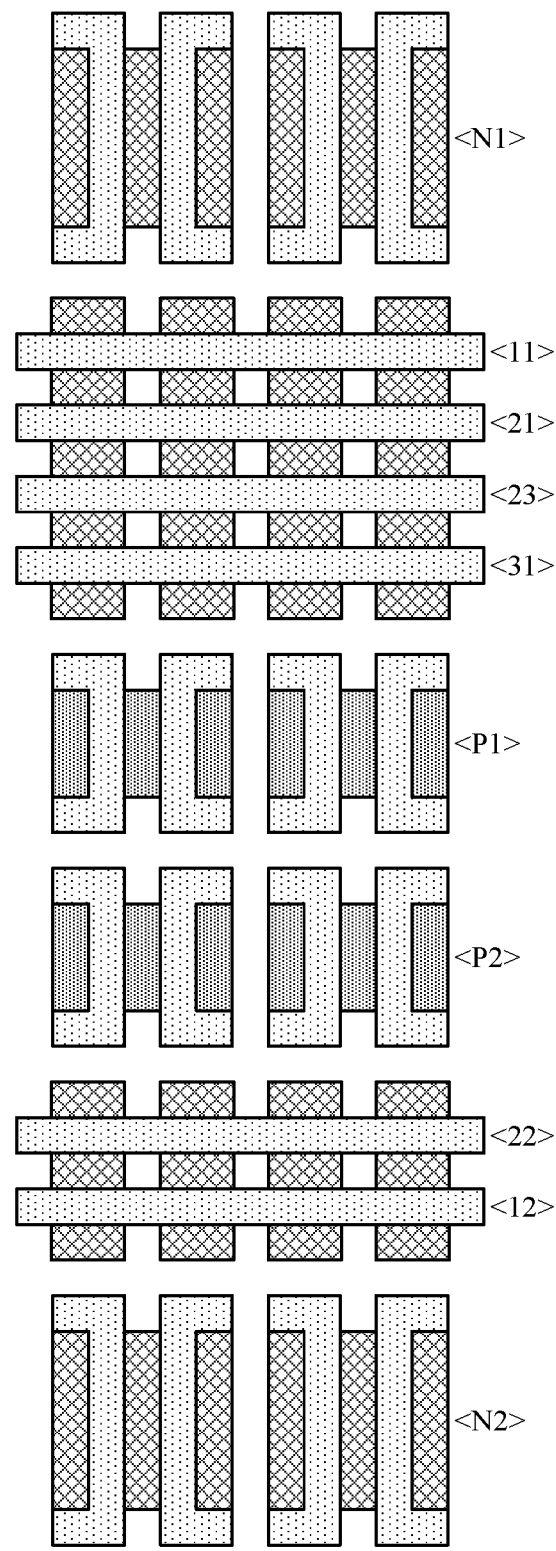
FIG. 12 is an eleventh schematic diagram of layout structure of a sense amplifier circuit provided by embodiments of the present disclosure.

Referring to FIG. 11 to FIG. 12, the third layout manner means that in the second direction, the first NMOS layout, the first processing structure layout, the first PMOS layout, the second PMOS layout, the second processing structure layout and the second NMOS layout are arranged in sequence.

The fourth layout manner means that in the second direction, the first PMOS layout, the first processing structure layout, the first NMOS layout, the second NMOS layout, the second processing structure layout and the second PMOS layout are arranged in sequence.

Figure 13:
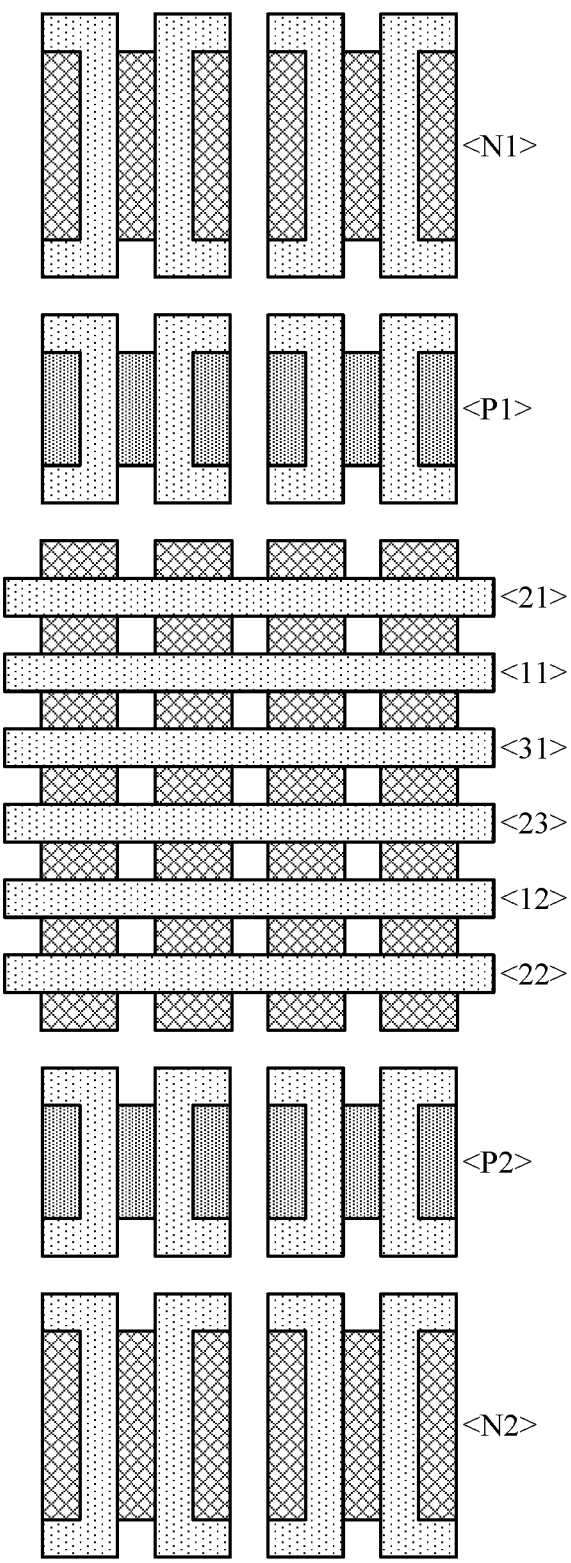
FIG. 13 is a twelfth schematic diagram of layout structure of a sense amplifier circuit provided by embodiments of the present disclosure.

Referring to FIG. 13, the fifth layout manner means that in the second direction, the first PMOS layout, the first NMOS layout, the first processing structure layout, the second processing structure layout, the second NMOS layout and the second PMOS layout are arranged in sequence.

Figure 14:
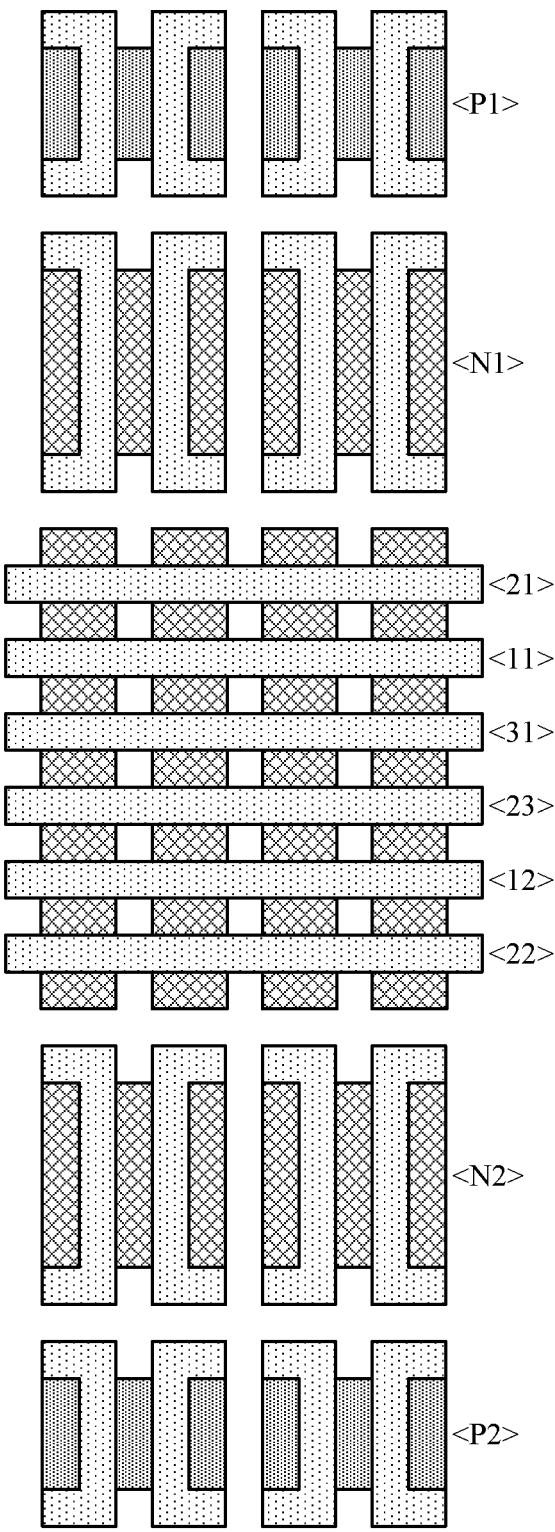
FIG. 14 is a thirteenth schematic diagram of layout structure of a sense amplifier circuit provided by embodiments of the present disclosure.
Figure 15:
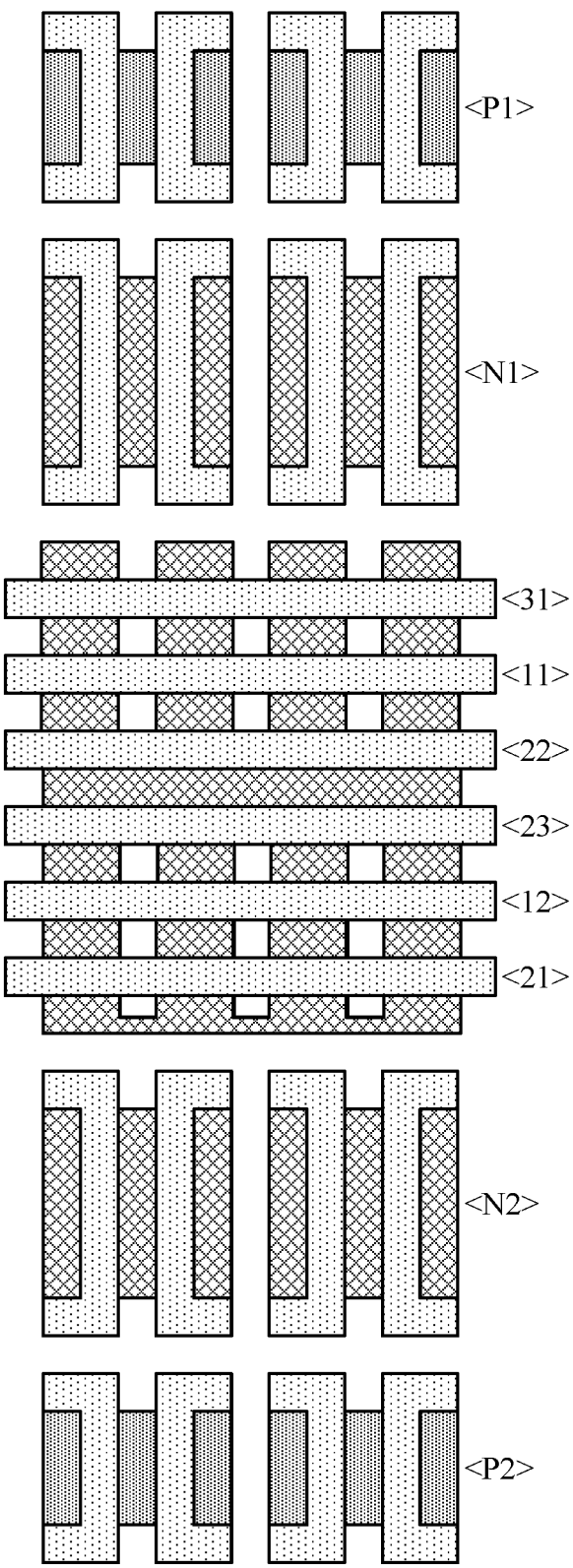
FIG. 15 is a fourteenth schematic diagram of layout structure of a sense amplifier circuit provided by embodiments of the present disclosure.

Referring to FIG. 14, the sixth layout manner means that in the second direction, the first NMOS layout, the first PMOS layout, the first processing structure layout, the second processing structure layout, the second PMOS layout and the second NMOS layout are arranged in sequence.

It should be noted that in the fifth layout manner and the sixth layout manner, the first active layers and the second active layers are connected. Further, referring to FIG. 15, the fifth layout manner and the sixth layout manner are still applicable to the way in which the first active layers for electrically connecting a preset voltage $V_{BLP}$ are connected to each other, and the second active layers for electrically connecting the preset voltage $V_{BLP}$ are connected to each other.

It should be noted that the specific connection manners of "source" and "drain" defined for the transistors as mentioned above do not limit the present embodiment. In other embodiments, the connection manners of using "drain" to replace "source" and using "source" to replace "drain" can be adopted.

In the offset cancellation process, the gate of the first PMOS transistor is connected to the sense amplifier bit line bar, and the drain is connected to the sense amplifier bit line. After the first PMOS transistor is turned on, the first signal terminal is electrically connected to the sense amplifier bit line, and the first signal terminal is used for receiving the high level corresponding to the logic "1", that is, the internal power supply voltage of the chip is received at the first signal terminal. At this time, the conducted first PMOS transistor affects the level of the sense amplifier bit line bar based on the level of the sense amplifier bit line bar and the threshold voltage. The gate of the second PMOS transistor is connected to the sense amplifier bit line, and the drain is connected to the sense amplifier bit line bar. After the second PMOS transistor is turned on, the first signal terminal is electrically connected to the sense amplifier bit line, and the first signal terminal is used for receiving the high level corresponding to the logic "1", that is, the internal power supply voltage of the chip is received at the first signal terminal. At this time, the conducted second PMOS transistor affects the level of the sense amplifier bit line bar based on the level of the sense amplifier bit line and the threshold voltage. The difference of the threshold voltage between the first PMOS transistor and the second PMOS transistor will cause the level difference between the sense amplifier bit line and the sense amplifier bit line bar, that is, the offset noise of the first PMOS transistor and the second PMOS transistor is reflected through the level of the sense amplifier bit line and the level of the sense amplifier bit line bar. The gate of the first NMOS transistor is connected to the sense amplifier bit line bar, and the drain is connected to the bit line. The gate of the second NMOS transistor is connected to the sense amplifier bit line and the drain is connected to the bit line bar. Due to the connection manner of the first isolation MOS transistor <11> and the second isolation MOS transistor <12>, the first isolation MOS transistor <11> and the second isolation MOS transistor <12> are not turned on when the offset cancellation is carried out, and the second signal terminal is also used for receiving the high level corresponding to the logic "1", that is, the internal power supply voltage of the chip is received at the second signal terminal. In this way, the conduction difference between the first NMOS transistor and the second NMOS transistor does not affect the sense amplifier bit line and the sense amplifier bit line bar, but can directly adjust the bit line voltage and the bit line bar voltage. In addition, the level of the sense amplifier bit line and the level of the sense amplifier bit line bar have reflected the offset noise of the first PMOS transistor and the second PMOS transistor, and the conduction degree of the first NMOS transistor is determined based on the level of the sense amplifier bit line bar and the threshold voltage of the first NMOS transistor, the conduction degree of the second NMOS transistor is determined based on the level of the sense amplifier bit line and the threshold voltage of the second NMOS transistor. At this time, after the first NMOS transistor and the second NMOS transistor are respectively turned on based on the sense amplifier bit line bar and the sense amplifier bit line, the adjusted bit line voltage and the bit line bar voltage reflect the offset noise of the first PMOS transistor and the second PMOS transistor, and simultaneously reflect the offset noise of the first NMOS transistor and the second NMOS transistor, that is, the offset cancellation operation of the sense amplifier circuit is completed. Therefore, the layout of the sense amplifier circuit provided by the embodiments of the present disclosure can avoid the layout of MOS transistors for offset cancellation, thereby reducing the layout area of the sense amplifier circuit.

It should be noted that in order to highlight the inventive part of the present disclosure, units that are not closely related to solving the technical problems proposed in the present disclosure are not introduced in the embodiments, but this does not mean that there are no other units in the embodiment. Those of ordinary skill in the art will appreciate that the above-described embodiments are specific embodiments for carrying out the present disclosure, and in practical application various, changes in form and detail may be made thereto without departing from the spirit and scope of the present disclosure.

Those of ordinary skill in the art will appreciate that the above-described embodiments are specific embodiments for carrying out the present disclosure, and in practical application, various changes in form and detail may be made thereto without departing from the spirit and scope of the present disclosure.

What is claimed is:

1. A sense amplifier circuit architecture, comprising:
   a first N-Metal-Oxide-Semiconductor (NMOS) layout, comprising first N-type active layers discretely arranged in a first direction, and first gate layers discretely arranged on the first N-type active layers;
   a second NMOS layout, comprising second N-type active layers discretely arranged in the first direction, and second gate layers discretely arranged on the second N-type active layers;
   a first P-Metal-Oxide-Semiconductor (PMOS) layout, comprising first P-type active layers discretely arranged in the first direction, and third gate layers discretely arranged on the first P-type active layers;
   a second PMOS layout, comprising second P-type active layers discretely arranged in the first direction, and fourth gate layers discretely arranged on the second P-type active layers;
   a first processing structure layout, comprising first active layers discretely arranged in the first direction and extending in a second direction, and a first isolation gate arranged on the first active layers and extending in the second direction; and
   a second processing structure layout, comprising second active layers discretely arranged in the first direction and extending in the second direction, and a second isolation gate arranged on the second active layers and extending in the second direction,
   wherein the first direction intersects the second direction;
   the first processing structure layout further comprises a first precharge gate, arranged on the first active layers and extending in the first direction, and the first precharge gate and the first isolation gate are arranged in the second direction in sequence; the second processing structure layout further comprises a second precharge gate and a third precharge gate, which are arranged on the second active layers and extending in the first direction, and the second precharge gate, the second isolation gate and the third precharge gate are arranged in the second direction in sequence;
   wherein the first processing structure layout further comprises an equalizing gate, arranged on the first active layers and extending in the first direction, and the first precharge gate, the first isolation gate, and the equalizing gate are arranged in the second direction in sequence; or
   the first processing structure layout further comprises a first precharge gate and a third precharge gate, which are arranged on the first active layers and extending in the first direction, and the first precharge gate, and the first isolation gate and the third precharge gate are arranged in the second direction in sequence; the second processing structure layout further comprises a second precharge gate, arranged on the second active layers and extending in the first direction, and the second precharge gate and the second isolation gate are arranged in the second direction in sequence; wherein the first processing structure layout further comprises an equalizing gate, arranged on the first active layers and extending in the first direction, and the first precharge gate, the first isolation gate, the equalizing gate, and the third precharge gate are arranged in the second direction in sequence.

2. The sense amplifier circuit architecture of claim 1, wherein
   in the first direction, the first active layers for electrically connecting a preset voltage are connected to each other.

3. The sense amplifier circuit architecture of claim 1, wherein
   in the first direction, the second active layers for electrically connecting a preset voltage are connected to each other.

4. The sense amplifier circuit architecture of claim 1, wherein
   in the second direction, the first processing structure layout, the first NMOS layout, the first PMOS layout, the second PMOS layout, the second NMOS layout, and the second processing structure layout are arranged in sequence.

5. The sense amplifier circuit architecture of claim 1, wherein
   in the second direction, the first processing structure layout, the first PMOS layout, the first NMOS layout, the second NMOS layout, the second PMOS layout, and the second processing structure layout are arranged in sequence.

6. The sense amplifier circuit architecture of claim 1, wherein
   in the second direction, the first NMOS layout, the first processing structure layout, the first PMOS layout, the second PMOS layout, the second processing structure layout, and the second NMOS layout are arranged in sequence.

7. The sense amplifier circuit architecture of claim 1, wherein
   in the second direction, the first PMOS layout, the first processing structure layout, the first NMOS layout, the second NMOS layout, the second processing structure layout, and the second PMOS layout are arranged in sequence.

8. The sense amplifier circuit architecture of claim 1, wherein
   in the second direction, the first PMOS layout, the first NMOS layout, the first processing structure layout, the second processing structure layout, the second NMOS layout, and the second PMOS layout are arranged in sequence.

9. The sense amplifier circuit architecture of claim 1, wherein
   in the second direction, the first NMOS layout, the first PMOS layout, the first processing structure layout, the second processing structure layout, the second PMOS layout, and the second NMOS layout are arranged in sequence.

10. The sense amplifier circuit architecture of claim 8, wherein
    the first active layers are connected to each other, and the second active layers are connected to each other.

11. The sense amplifier circuit architecture of claim 9, wherein
    the first active layers are connected to each other, and the second active layers are connected to each other.

12. The sense amplifier circuit architecture of claim 1, wherein
the first direction is perpendicular to the second direction.

\* \* \* \* \*